WITNESSES:
Bernard R. Giegler
James F. Young

INVENTOR
Robert E. Hull
BY
Clement J. Paznokas
ATTORNEY

3,327,235
DC AMPLIFIER HAVING SINGLE TIME DELAY CHARACTERISTIC

Robert E. Hull, Amherst, N.Y., assignor to Westinghouse Electric Corporation, East Pittsburgh, Pa., a corporation of Pennsylvania Filed May 28, 1964, Ser. No. 370,840
17 Claims. (Cl. 330—19)

This invention relates to amplifiers which may be used as the amplifier element in operational amplifiers. More particularly, the invention is directed to circuit means for shaping the transfer characteristic of an amplifier.

While operational amplifiers are best known for their use in analog computers, they are also widely used for instrumentation and in control and regulating systems, especially in feedback type control systems. Operational amplifiers are used to perform the basic mathematical operations of addition, subtraction, differentiation, integration, etc. These operations are obtained through well known techniques involving the use of passive circuit elements, generally resistors and capacitors, in input and feedback networks in association with a high-gain DC (direct current) amplifier to obtain the desired transfer characteristic.

For use as an operational amplifier, a DC amplifier should have a low drift and a high DC gain to provide accuracy when used in the operational amplifier. Accuracy should be maintained over the operating range of frequencies. Thus a wide band-pass is desirable, for example, 10,000 c.p.s. (cycles per second) when connected in an operational amplifier for a gain of 1 using input and feedback resistors of 100,000 ohms. Additionally, it is desirable that the DC amplifier gain-frequency product should be high, for example, at least 250,000 (gain equals one at 250 kc.). In such cases the gain should attenuate with frequency at 20 db/decade, crossing zero-db at 250 kc. or more, as may be expressed in a Bode plot which plots gain in db (decibels) versus frequency (cycles/second) along logarithmic scales. In other words, the DC amplifier should have the transfer characteristic of a single time delay having a maximum phase shift not exceeding 90°. These characteristics should hold true over a frequency range well exceeding the frequency at which the gain reduces to one. These characteristics are important in order to provide proper closed loop stability for all conditions of feedback impedance.

The above desired characteristics have heretofore been obtainable but at relatively high cost. Also, in prior art amplifiers break points of the transfer characteristic (Bode plot) are dependent on or affected in a major way by the active element parameters (transistors, etc.). In prior art amplifiers stabilizing circuits were added or altered after the feedback circuit was selected in order to stabilize the operational amplifier.

It is therefore an object of the present invention to provide a novel DC amplifier having characteristics making it desirable for use as an operational amplifier.

Another object of the invention is to provide a DC amplifier wherein the aforesaid desirable characteristics are obtainable at relatively low cost.

Another object of the present invention is to provide a relatively simple and economical DC amplifier having any or all of the heretofore discussed desirable features.

Another object of the present invention is to provide a DC amplifier whose transfer characteristic is generally shaped independently of the active element parameters and whose break points are substantially only a function of passaive element parameters.

Still another object is to provide an amplifier which for any feedback circuit selected for operational use will be stable without requiring further addition or modification of the amplifier itself.

A further object of the invention is to provide novel circuit structure for shaping a transfer characteristic of a DC amplifier whose characteristic corresponds to that of a single time delay.

In accordance with one embodiment of the invention the above objects are attained in an amplifier having a first amplifier section driving in cascade a second amplifying section, the first having a transfer characteristic having lead and lag components, and the second having a characteristic with a lag component which substantially cancels the lead component of the first amplifying section, thereby providing a composite transfer characteristic having a single lag or the characteristic of a single time delay. A more specific aspect of the invention contemplates a capacitively coupled negative feedback circuit between the output and input of the first amplifier section, which for frequencies below a predetermined frequency provides decreasing gain as frequency increases, and which provides zero db gain (unity gain) for frequencies above said predetermined frequency. To complement this, the second amplifier section has constant gain up to the predetermined frequency, and decreasing gain with increasing frequency above said predetermined frequency. The composite of the two amplifiers thus has the characteristic of a single time delay.

Other and further objects and advantages of the present invention will become evident from the following detailed description taken in connection with the drawings wherein a preferred embodiment of the invention is illustrated.

Figure 1:
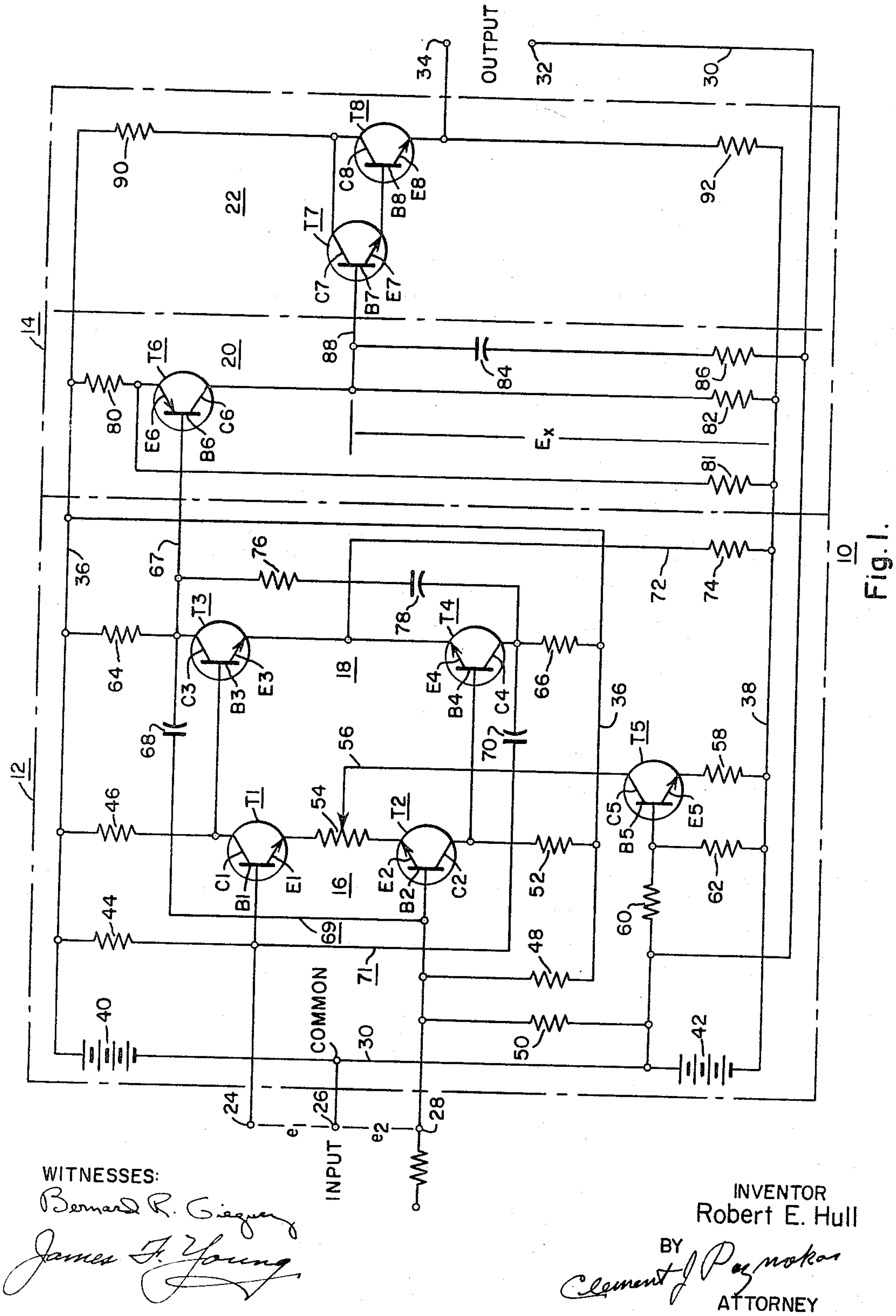
FIGURE 1 is a schematic diagram of a DC amplifier embodying features of the invention.

Referring now to FIGURE 1, there is shown a DC amplifier 10 including cascaded amplifying sections 12 and 14. The section 12 has first and second cascaded differential amplifier stages 16 and 18. Section 14 has two cascaded stages 20 and 22. The inputs to amplifier 10 are at terminals 24–26 and at terminals 28–26. Terminal 26 is connected to a common line 30 that is connected to an output terminal 32 of the amplifier 10. The other output terminal of amplifier 10 is at 34. Amplifier stages 16 and 22 are respectively the input and output stages of amplifier 10. The output of amplifier 10 is responsive to and a function of the difference between the voltage $e_1$ at input terminal 24 (as related to common terminal 26) and the voltage $e_2$ at input terminal 26 (as related to common terminal 26).

Line 30 is the common for the power supply which supplies positive voltage to a positive bus 36 and negative voltage to a negative bus 38. The power supply may, for example, be the batteries 40 and 42.

There are employed in amplifier 10 a number of translating devices T indicated at T1, T2, T3, T4, T5, T6, T7 and T8, each having an input electrode, an output electrode and a common electrode, the latter being common to the input and output circuits of the associated translating device. Although other suitable amplifying devices may be employed, the translating devices T are shown by way of preferred examples as transistors. Although other types of transistors may be employed, silicon transistors are desirable because they allow high operating temperatures, have very low leakage currents, and good uniformity between units. The respective base, collector and emitter electrodes of each transistor are indicated by the reference characters B, C and E, respectively, each suffixed with the identifying number of the associated transistor. For example, the base electrode of transistor T4 is referenced as B4. With respect to transistors connected in common emitter configuration, the base is the input electrode, the collector is the output electrode and the emitter is the common electrode. In common collector configuration, the base is the input electrode, the emitter electrode is the output electrode while the collector electrode is the common electrode. By way of example, transistors T1, T2, T3, T4, T5, T7 and T8 are shown as n-p-n type, while transistor T6 is shown as p-n-p type.

In the first differential amplifier stage 16, transistors T1 and T2 each are connected in common emitter configuration. The base B1 of transistor T1 is connected to input terminal 24, and to the positive bus 36 through a bias resistor 44. Collector C1 is connected to the base B3 and through a collector resistor 46 to the positive bus 36. Base B2 is connected to input terminal 28 and through a bias resistor 48 to the positive bus 36. Base B2 is connected to input terminal 28 and through a bias resistor 38 to the positive bus 36. A resistor 50 is connected between base B2 and the power supply common 30. Collector C2 is connected to base B4 and through a collector resistor 52 to the positive bus 36.

Amplifier stage 16 has a constant-current generator type emitter circuit wherein emitters E1 and E2 are connected through a balancing potentiometer 54 to a conductor 56 connected to a constant current generating arrangement including transistor T5. Line 56 is connected to the collector C5 of transistor T5 whose emitter E5 is connected through a resistor 58 to the negative bus 38, and whose base B5 is connected through resistors 60 and 62 to the power supply common 30 and the negative bus 38 respectively. The circuit relations of transistor T5 and resistors 58, 60 and 62 form a constant current generator tending to maintain the current in line 56 at a constant value determined by the bias supplied to base B5 by the voltage dividing arrangement including resistors 60 and 62. Resistor 58 provides the necessary feedback, which, compared to the bias established by resistors 60 and 62 provides an error signal that drives transistor T5 to maintain its output current on line 56 constant.

Potentiometer 54 is adjusted to balance the emitter current flow through transistors T1 and T2 and provide zero output voltage from the amplifier output terminals 32–34 when there is zero voltage difference between the voltages on input terminals 24 and 28, each referenced to common input terminal 26. The applied voltages and the parameters of the circuit elements associated with each transistor T1 and T2 are chosen to so bias each of these transistors as to provide an operating point which will provide for each transistor symmetrical output variations in opposite directions (equal positive and negative output swings) around the quiescent output in response to equal positive and negative input drive signals applied to the transistor, thus to provide for each transistor a linear output across the operating range of negative and positive values of input signals (class A operation). Thus, equal magnitude input signals of opposite polarities applied to each of these transistors drive the output of the transistor equal increments or symmetrically on opposite sides of the quiescent output value of the transistor. Note quiescent output is the output value at zero input drive signal. Any positive or negative difference between the voltages on terminals 24 and 28 will drive the outputs of transistors T1 and T2 correspondingly in opposite directions (push-pull). Thus, the respective outputs of transistors T1 and T2 will be driven in inverse relation, i.e., in opposite directions (push-pull), in response to any given input signal of either polarity applied to input terminal 24.

In response to the application of a signal voltage on terminal 24, transistors T1 and T2 are differentially driven by two concurrent intermediate effects. For example, when a positive signal is applied to terminal 24, transistor T1 is driven upward (more conductive). Because of the constant current constraint on line 56 imposed by transistor T5, the current increase through transistor T1 attempts to force a corresponding current decrease through transistor T2. In a concomitant action, the increased conduction through transistor T1 increases the current in line 56, thereby forcing, through the regulation of transistor T5, reduced conduction in transistor T5, thus increasing its effective impedance and thereby making collector C5 and emitter E2 more positive, thereby to drive transistor T2 downward (reduced conduction). The above actions provide a true differential effect. The production of the differential effect may also be explained by the fact that each of transistors T1 and T2 operates or acts as an emitter follower driving the emitter of the other transistor. As a result of this action increased conduction through transistor T1 causes the upper end of line 56 to go more positive thereby making E2 more positive to drive transistor T2 downward. Resistor (potentiometer) 54 is relatively small; impedance through line 56 is very large due to constant current action of T5; therefore a voltage change at E1 simultaneously occurs at E2.

In the second stage 18 of amplifier 12, collectors C3 and C4 are connected through collector resistors 64 and 66, respectively, to the positive bus 36. Collector C3 is also connected through output line 67 to base B6 of transistor T6 to provide a drive for the first stage 20 of amplifier 14. Collector C3 is also capacitively coupled to base B2 by means of a capacitor 68 to form part of a negative feedback circuit 69 which provides negative feedback to the first stage 16. Collector C4 is also capacitively coupled to base B1 by means of a capacitor 70 to provide symmetry to both sides of amplifier 12 and also to maintain approximately constant the input impedance at input terminal 24. As frequency goes up, less and less input signal current goes into base B1 while more and more of this signal current will be diverted through capacitor 70 to the common line 30.

The emitters E3 and E4 of transistors T3 and T4 are connected through a common line 72 and a resistor 74 to the negative bus 38. As a result of this connection, each of transistors T3 and T4 acts as an emitter follower driving the emitter of the other transistor. A resistor 76 and a capacitor 78 connected between collector C4 and line 69 form a stabilizing circuit for amplifier 12, to insure the high-frequency stability of this amplifier in the frequency range well beyond the frequency range used by the amplifier. This circuit does not become effective until frequencies in the 5 to 10 megacycle range are encountered and thus does not affect the amplifier until well past the frequency at which the gain becomes one (250 kc.). This circuit compensates for phase shifts which occur in the transistors and due to circuit stray capacitance, etc., which could cause instability when collectors C3 and C4 are connected back to bases B2 and B1, respectively.

Transistor T3 is biased to produce a predetermined "pivot" output value in response to the quiescent output of transistor T1, and to provide substantially equal positive and negative output swings of transistor T3 around its pivot output value in response to equal negative and positive output swings of transistor T1 around its quiescent output. Each of transistors T1 and T3 in the configuration shown is an inverting amplifier. As a result, the cascading of transistors T1 and T3 provides a double inversion. Thus, if the input signal applied to terminal 24 goes more positive, then the output of transistor T3 on line 67 goes more positive and vice versa. The biasing and relationship between transistors T2 and T4 is arranged to provide substantially the same results as the combination of transistors T1 and T3. That is, transistor T4 is biased to produce a predetermined pivot output value in response to the quiescent output of transistor T2, and to produce equal positive and negative output swings around its pivot output value in response to equal negative and positive output swings of transistor T2 around its quiescent output value.

It should be noted that while transistor T2 is differentially driven relative to and by transistor T1 through emitter drive, transistor T2 may additionally be driven by signals applied to input terminal 28. Either form of drive may be termed "external drive" to differentiate from permanent bias. The cascaded transistors T2 and T4 also perform a double inversion of any drive applied to transistor T2.

The parameters of capacitors 68 and 70 are chosen to provide negative feedback which attenuates the amplifier 12 output proportionately with increase in frequency until a predetermined frequency is reached at which point capacitors 68 and 70 are substantial short circuits to the AC (alternating current) components of the signals, thus tying the collectors C3 and C4 to bases B2 and B1 respectively. As a result, at and above the predetermined frequency collector C3 is at substantially the same AC potential and phase as base B2, and collector C4 is substantially at the same AC potential and phasing as base B1. Thus, at the aforesaid predetermined frequency, the gain of amplifier becomes unity with zero phase shift.

Capacitor 68 and resistor 50 are the main components of an RC circuit which determines the first and second breakpoints of the gain vs. frequency transfer characterstic of amplifier 12. The first breakpoint is downward and provides a lag component or time delay in which Laplace operator form may be represented as $$\frac{1}{1+t_1P}$$

wherein P is the Laplace operator ($j\omega$), and $t_1$ is the exponential time constant of the term defined as the time in seconds to reach 63% of its ultimate response to a step change (in this case an RC time constant).

$$\frac{1}{t_1}=\omega_1$$

the break frequency of the term. Thus, $$\frac{1}{1+t_1P}=\frac{1}{1+\frac{j\omega}{\omega_1}}$$

By way of example, the first breakpoint of amplifier 12 may be approximately at 14.5 c.p.s. (cycles per second) as illustrated in the Bode plot in FIG. 2 where the curve A is the transfer characteristic of amplifier 12.

Figures 2, 3:
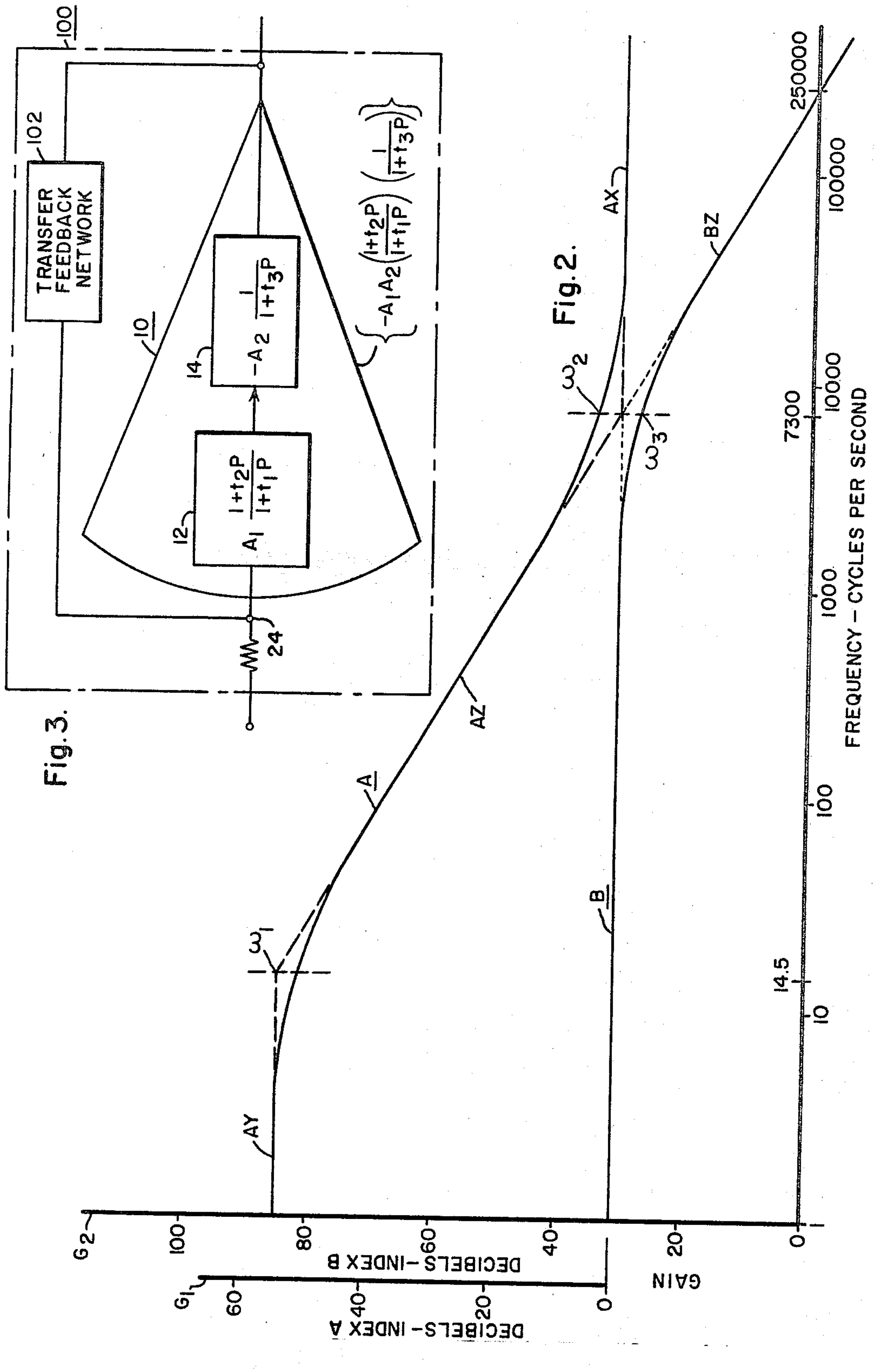
FIGURE 2 is a graph showing a Bode plot illustrating characteristics of the circuit of FIG. 1.
FIGURE 3 is a block diagram of an operational amplifier employing the amplifier of the present invention.

A Bode plot is a diagram where gain is plotted vs. frequency for the elements of a system in order to analyze system stability characteristics. Although a Bode diagram may be plotted point by point by use of a test set-up, it is usually drawn from known transfer function control elements. It is generally drawn in approximate form, using asymptotes to the straight line portion of the actual characteristics. In FIG. 2, the solid lines are the true curves, while the dashed (for curve A) and dotted (for curve B) lines are the asymptotes. At downward breaks, the actual curves are 3 db below the intersection of the asymptotes. At the upward break, the actual curve A is 3 db above the intersection of the asymptotes. For most purposes, the approximate plot using asymptotes is sufficient.

The horizontal scale is calibrated for frequency and the vertical scale for gain or amplification. Gain and frequency are plotted in logarithmic scales. In the plot shown, a semi-log background is employed, gain being plotted in $$\text{db}-20\log_{10}\frac{e_{out}}{e_{in}}$$

db gain is a function of output versus sine wave input. The use of a logarithmic frequency scale allows the attenuation slope to be similar at various frequencies since equal distances along the horizontal scale will then be equal frequency ratios. The method used in making the plot of FIG. 2 gives a straight line characteristic for ease in constructing the plot. The first breakpoint of amplifier 12 associated with $t_1$ is indicated at $\omega_1$ on curve A in FIG. 2.

When transistor T1 is driven upward in response to the application of a positive input signal to terminal 24, collector C1 and base B3 are driven more negative thereby driving transistor T3 downward and making collector C3 more positive. In the meantime, the differential drive of stage 16 forces collector C2 and base B4 more positive, thereby driving transistor T4 upward and making collector C4 more negative. When collector C3 goes more positive, the feedback through capacitor 68 makes base B2 more positive, tending to drive transistor T2 upward. Because of the hereinbefore described differential drive action, emitter E1 is driven more positive, thereby tending to drive transistor T1 downward. Thus, the voltage on collector C3 applied through the feedback circuit 69 including capacitor 68, provides negative feedback to the first stage 16. In the meantime, circuit symmetry is effected by the feedback circuit 71 including capacitor 70. The action of feedback through 68 and to E1 reduces the current into B1 for a given voltage drive at B1. Therefore, the impedance into B1 increases with frequency. Feedback through 70 to B1 however tends to draw more current away from B1 as frequency increases thus tending to equalize the impedance into B1.

In response to a negative input signal being applied to input terminal 24 and base B1, corresponding opposite reactions take place in amplifier section 12. The output of amplifier section 12 is taken from across collector resistor 64 of transistor T3, and applied through the positive bus 36 and output line 67 across the base-emitter junction of transistor T6 in stage 20.

The decreased impedance of capacitors 68 and 70 to substantially short circuit to alternating current at high frequencies results in an upward breakpoint and the lead term $1+t_2P$ for the transfer characteristic of amplifier 12, $t_2$ is the RC time constant of the lead term, and P the Laplace operator. $1/t_2=\omega_2=$break frequency of lead term. The breakpoint associated with the lead term $1+t_2P$ may for example be approximately 7,300 c.p.s. as indicated at $\omega_2$ on curve A in FIG. 2.

As a result of the above-described lag and lead terms, the composite transfer characteristic for amplifier section 12 is $$\frac{e_{out}}{e_{in}}=A_1\frac{1+t_2P}{1+t_1P}$$

where $e_{out}$ and $e_{in}$ are the output and input voltages respectively, and $A_1$ is the DC voltage gain of amplifier 12, and $t_1=(1+A_1)t_2$.

In the following examples $R_2$ is resistor 50, $C_1$ is capacitor 68, $t_2=R_2C_1$, $e_1$ is voltage on terminal 24, $e_2$ is voltage on terminal 28, $e_{01}$ is output on line 67, and $t_1=(1+A_1)R_2C_1$ $$e_{01}=A_1(e_1-e_2)$$

$$e_2=e_{01}\frac{R_2}{R_2+\frac{1}{C_1P}}$$

therefore $$e_{01}=A_1e_1-A_1\left(\frac{e_{01}R_2}{R_2+\frac{1}{C_1P}}\right)$$

$$\frac{e_{01}}{e_1}=A_1\left(\frac{1+R_2C_1P}{1+(1+A_1)R_2C_1P}\right)$$

let $$t_2=R_2C_1$$

$$t_1=(1+A_1)R_2C_1$$

then $$t_1=(1+A_1)t_2$$

Since the horizontal straight line portion AX associated with the lead term $1+t_2P$ is at substantially unity gain, it lies in line with the zero db index mark on the gain scale $G_1$ for amplifier 12, whose gain may, for example be approximately 55 db as indicated in FIG. 2.

In amplifier stage 20, emitter E6 is connected through a resistor 80 to the positive bus 36. Transistor T6 is shown by way of example as a p-n-p transistor. Collector C6 is connected through a collector resistor 82 to the negative bus 38 and, through a capacitor 84 and a resistor 86, to the power supply common 30. Collector C6 is also connected, through an output line 88 of stage 20 to base B7 to provide a drive for amplifier stage 22.

The first stage 20 of amplifier 14 provides added voltage gain to the amplifier 10. The gain of stage 20 depends on and is nearly equal to the ratio of resistance at collector C6 to net resistance at emitter E6. Thus the gain of stage 20 depends on and very nearly equals the ratio of collector resistor 82 to the emitter resistor 80 in parallel with resistor 81. Resistor 81 is a bleeding resistor to reduce the voltage at emitter E6, thus allowing the impedance in the emitter circuit to be a smaller value, thereby to help increase the ratio between resistor 82 and the emitter circuit resistance in order to increase the gain of the stage 20.

Transistor T6 is biased to provide a predetermined pivot output value in response to the pivot output value of transistor T3, and to provide equal opposite polarity swings around output pivot value of transistor in response to equal positive and negative output swings of transistor T3 around its pivotal output value.

Stage 20 is provided with a lag network to impart to the stage, and consequently the section 14, a lag term transfer characteristic $$\frac{1}{1+t_3P}$$

having a breakpoint (break frequency) $\omega_3$ occurring for example at approximately 7,300 c.p.s. as indicated at $\omega_3$ in FIG. 2. The major and dominating components of the lag network are the resistor 82 and the capacitor 84. Resistor 86 may have a relatively low value, for example, around 50 ohms. If the value of resistor 86 is kept low, it becomes a minor factor in the lag network. Resistor 82 is relatively high, for example, around 21,000 ohms. Capacitor 84 is in a shunt path across resistor 82. With the power supply having low impedance, the capacitor is effectively connected in parallel or shunt with resistor 82. Actually the resistor 86 and capacitor 84 may be connected directly across resistor 82 for successful operation. As the signal frequency increases, the impedance of capacitor 84 decreases thus attenuating the output of stage 20 as frequency increases. The transfer characteristic of amplifier section 14 is the curve B in FIG. 2.

Resistor 86 in conjunction with capacitor 84 provides a high frequency lead term that cancels high frequency lags that begin to occur well beyond the 250 kc. bandpass to insure a phase shift not exceeding 90° through the 250 kc. range.

The second stage 22 of amplifier 14 includes transistors T7 and T8, shown by way of example as n-p-n transistors connected in an emitter follower circuit configuration which provides no voltage gain but does supply power gain and low impedance output. The input impedance is high. In this stage, the respective collectors of transistors T7 and T8 are connected through a resistor 90 to the positive bus 36. The value of this resistor is chosen to limit the power dissipation requirement of transistor T8 and also to provide short circuit protection for the output stage. The emitter E7 is connected to base B8, and the emitter E8 which is connected to the output terminal 34, is also connected through an emitter follower resistor 92 to the negative bus 38.

It will be noted that the output terminals 32 and 34 are across one diagonal of a bridge arrangement including batteries 40 and 42 in adjacent arms, and resistor 92 and resistor 90 with transistor T8 in adjacent arms. The circuit parameters of this bridge are so chosen that the output at 32 and 34 is bi-directional, i.e., can be driven either positive or negative depending on whether the collector-emitter current of transistor T8 is above or below a predetermined pivot value. Transistor T8 assumes its pivot output value in response to the pivot output value of transistor T6.

The parameters of the circuit elements associated with transistors in stages 16, 18 and 20 are chosen to provide the respective transistors with operating points such that each transistor furnishes an output which may be referred to as "pivot output value" in response to zero input signal on terminal 24, and substantially symmetrical output changes in opposite directions from the pivot value in response to opposite polarity input signals applied to input terminal 24. Thus at zero input drive to transistor T1 or when the difference between the voltages at input terminals 24 and 28 is zero, transistor T6 provides a predetermined pivotal output value, and the output of transistor T6 may be driven higher or lower depending on the polarity of input drive signals applied to input terminal 24 or the difference polarity of drive signals applied to terminals 24 and 28.

The circuit parameters of stage 22 are chosen so that when the aforesaid predetermined pivot output value of transistor T6 (corresponding to zero input at input 24) is applied to base B7, the output of stage 22 and of the entire amplifier 10 at output terminals 32 and 34 is zero. Potentiometer 54 may be used as a trimmer to adjust for this condition of zero output. The types of transistors and cascading relations are chosen to result in an output at 32 and 34 for amplifier 10 which is an inverse function of its input at terminal 24, that is, an inverting amplifier. Thus, when a positive signal is applied to terminal 24, the output is negative at terminal 34; and when a negative signal is applied to terminal 24, the output at terminal 34 is positive. Thus, the amplifier 10 is an inverting bi-directional amplifier.

Stage 22 does not alter the transfer characteristic of stage 20. Thus, the transfer characteristic of amplifier section 14 is $$\frac{e_{out}}{e_{in}}=-A_2\frac{1}{1+t_3P}$$

where $-A_2$ is the D-C gain of amplifier 14, $t_3$ is the RC time constant of the lag term, and P is the Laplace operator. By way of example the gain of amplifier section 14 is shown as about 30 db as indicated in FIG. 2 on gain scale G2.

In accordance with a preferred embodiment of the present invention, the circuit parameters are chosen to make $t_3$ substantially equal to $t_2$. Thus, the upward breakpoint of the transfer characteristic of amplifier 12 is at substantially the same frequency as the downward breakpoint of the transfer characteristic of amplifier 14. In other words, the break frequency of the lead term of the amplifier section 12 transfer characteristic is substantially the same as the break frequency of the lag term characteristic of amplifier section 14.

The closer that $t_3$ and $t_2$ are made to being equal, the higher the quality of the amplifier, that is, the more nearly the amplifier transfer characteristic corresponds to a single time delay.

However, although it is preferred that $t_2$ and $t_3$ be substantially equal, either of $t_2$ and $t_3$ may differ from the other by as much as ±25% and still provide an acceptable amplifier for less stringent applications, for example where a slower response can be tolerated. Thus, while $t_2$ and $t_3$ should be substantially equal for the highest quality amplifier with a transfer characteristic corresponding to a single time delay, the invention may also be practiced by selecting the values of $t_2$ and $t_3$ such that $t_2$ is from 75% to 125% of $t_3$, and $t_3$ is from 75% to 125% of $t_2$, i.e., each of $t_2$ and $t_3$ has the value of the other within a tolerance of ±25%.

The composite transfer characteristic of amplifier 10 is $$\frac{e_{out}}{e_{in}}=\left(A_1\frac{1+t_2P}{1+t_1P}\right)\left(-A_2\frac{1}{1+t_3P}\right)$$

If $t_2$ is made equal to $t_3$, the transfer characteristic becomes $$\frac{e_{out}}{e_{in}}=-A_1A_2\frac{1}{1+t_1P}$$

By placing the lowest frequency break ($\omega_1$) in the first amplifier in position (amplifier 12), and the highest frequency break ($\omega_3$) in the second amplifier in position (amplifier 14), full output amplitude and power is obtained from the composite amplifier over a frequency range exceeding the $\omega_3$ frequency.

It will be noted that in order to make an inverting amplifier 10 either section 12 or section 14 must be an inverting section. In the example disclosed section 14 is the inverting section. However, from the teachings disclosed herein it will be apparent to those skilled in the art that section 12 may be made the inverting section while section 14 is made non-inverting.

The composite transfer characteristic of amplifier 10 is illustrated by adding following sections of the curves in FIG. 2: horizontal section AY of curve A, sloping section AZ of curve A, and sloping section BZ of curve B. Thus, the transfer characteristic of amplifier 10 corresponds to a single time delay, most desirable in a DC amplifier for use as an operational amplifier. As shown, a time delay element is drawn as a horizontal line with no attenuation up to its natural frequency or breakpoint. Beyond this, it is drawn at a slope of −20 db per decade.

Since $$\omega_1=\frac{1}{(1+A_1)t_2}$$

if again A changes due to changes in component parameters (especially transistors T1, T2, T3 and T4), only $\omega_1$ is affected, while $\omega_2$ and $\omega_3$ are unaffected. $\omega_2$ and $\omega_3$ are functions of passive components only. If $\omega_1$ changes due to change of $A_1$, only the initial portion of curve A changes as indicated by the -o- curve projection, the $\omega_1$ point for this curve being indicated at F. This does not affect $\omega$ at zero db or the stability of the amplifier.

In a successful operating example of the invention, the various circuit components of FIGURE 1 have the following values and type designations:

| | | |
|---|---|---|
| Transistors T1, T2, T3, T4, T5 | | Type 2N2195 |
| Transistor T6 | | Type 2N1132 |
| Transistors T7 and T8 | | Type 2N1613 |
| Resistors 44, 48 | megohms each | 10 |
| Resistor 50 | kilohms | 10 |
| Resistors 46, 52 | kilohms each | 178 |
| Resistor 58 | kilohms | 68.1 |
| Resistors 60, 62, 82 | kilohms each | 21.5 |
| Resistors 64, 66 | do | 56.2 |
| Resistor 74 | kilohms | 121 |
| Resistor 76 | ohms | 316 |
| Resistor 80 | do | 681 |
| Resistor 81 | kilohms | 5.62 |
| Resistor 86 | ohms | 47 |
| Resistor 90 | do | 200 |
| Resistor 92 | do | 890 |
| Potentiometer 54 | do | 500 |
| Capacitors 68–70 | mfd. each | .0022 |
| Capacitors 78 and 84 | do | .001 |
| Batteries 40 and 42 | volts each | 24 |

The breakpoints $\omega_1$, $\omega_2$, and $\omega_3$, for the example using the above component values, may be approximately computed as follows:

$A_1$ is approximately 55 db≅500 volts/volt, $t_1=(1+A_1)$ (resistor 50×capacitor 68)$=501\times10{,}000\times0.0022\times10^{-6}=0.011$ second, $t_2=$resistor 50×capacitor 68$=10{,}000\times0.0022\times10^{-6}=0.000022$ second, $t_3=$resistor 82×capacitor 84$=21{,}500\times0.001\times10^{-6}=0.0000215$ second, $\omega_1=1/t_1=90.9$ radians/second=14.5 c.p.s. (cycles/second), $\omega_2=1/t_2=45{,}400$ rad./sec.=7250 c.p.s., $\omega_3=1/t_3=46{,}500$ rad./sec.=7400 c.p.s., Thus $t_2\cong t_3$ and $\omega_2\cong\omega_3$.

In FIG. 3, which shows an example of the use of amplifier 10 of FIG. 1 in an operation amplifier 100, a transfer impedance feedback network 102 is shown connected around amplifier 10. For example, the feedback network 102 may be a capacitor, thus making the operational amplifier 100 an integrator which would provide to the amplifier 100 the transfer characteristic $$\frac{e_{out}}{e_{in}}=-\frac{1}{tP}$$

where $t$ is the time constant and P is the Laplace operator. However, as indicated by the legends attached to amplifier 10, amplifier 10 itself has the transfer characteristic imparted to it by the transfer characteristics of the sections 14 and 12 as indicated by the associated legends in FIG. 3. These characteristics provide accuracy to the transfer characteristics of the operational amplifier.

Another example of feedback network 102 is a capacitor in series with a resistor, making the amplifier 100 a proportional + integral operator.

In normal operation as an operational amplifier the input signals are applied through an input impedance to input terminal 24, with input terminal 28 connected to common through resistor 50. However, if desired, separate signals may be applied to terminals 24 and 28 to obtain an output at 34 and 32 which is a function of their difference. Or the operational amplifier can be used non-inverting by connecting terminal 24 to common through an impedance and applying the input signal to an impedance network connected to terminal 28.

From the foregoing description, it will be appreciated that the present invention provides an economical yet accurate DC amplifier admirably suited for use in operational amplifiers.

While the invention has been particularly shown and described with reference to a preferred embodiment thereof, it will be understood by those skilled in the art that various changes in form and details may be made therein without departing from the spirit and scope of the invention.

I claim as my invention:

1. Amplifying apparatus comprising first and second power supply bussses adapted for connection to opposite sides of a power supply source, first, second, third and fourth translating devices each having an input electrode, an output electrode and a common electrode, a differential amplifier section having respective input and output means, said differential amplifier section having first and second differential stages, said first differential stage including a first resistor and said first and second devices connected in differential amplifier configuration with the common electrodes of these devices connected through said first resistor to one of said busses whereby the output change of each of the first and second devices is substantially proportional to the difference between the voltages applied to the inputs of these devices, the outputs of the first and second devices being in push-pull relation, said second differential stage including a second resistor and said third and fourth devices connected in differential amplifier configuration with the common electrodes of these devices connected through the second resistor to one of said busses whereby the output change of each of the third and fourth devices is proportional to the difference between voltages applied to the inputs of these devices, the outputs of the third and fourth devices being in push-pull configuration, there being a phase inversion between the input and output of each of said devices, means coupling the output electrode of the first device to the input electrode of the third device, means coupling the output electrode of the second device to the input electrode of the fourth device there being a phase inversion between the outputs of said first and third devices and between the outputs of said second and fourth devices, a capacitively coupled feedback circuit connecting the output electrode of the third device to the input electrode of the scond device, a capacitively coupled feedback circut connecting the output electrode of the fourth device to the input electrode of the first device, the impedance of each of said feedback circuits decreasing as frequency increases for frequency values below a predetermined frequency $\omega_2$ expressed in radians/second, each of said feedback circuits having substantially zero impedance for frequencies above said predetermined frequency, the time constant associated with said predetermined frequency being $t_2$ expressed in seconds and where $$t_2=\frac{1}{\omega_2}$$

a second amplifying section having respective input and output circuts, the input circuit of the second amplifier section being coupled to the output circuit means of said differential amplifier section, said second amplifying section having a constant gain for all frequencies below a certain frequency $\omega_3$ expressed in radians/second, and means including an RC network for causing the gain of said second amplifying section to decrease as frequency increases in a frequency range immediately above said certain frequency, the time constant associated with said certain frequency being $t_3$ expressed in seconds and where $$t_3=\frac{1}{\omega_3}$$

the value of each of $t_2$ and $t_3$ being in the range extending approximately from 75% to 125% of the value of the other.

2. The combination as in claim 1 wherein said predetermined and certain frequencies are substantially the same value.

3. The combination as in claim 1 wherein each of said devices comprises transistor means.

4. The combination as in claim 1 and further including a negative feedback circuit connected between the output circuit of the second amplifying section and the input circuit means of the differential amplifier section.

5. Amplifying apparatus comprising first and second power supply lines adapted for connection to opposite sides of a power supply source, first, second, third and fourth translating devices each having an input electrode, an output electrode and a common electrode, a first differential stage including a first resistor and said first and second devices connected in differential amplifier configuration with the common electrodes of these devices connected through the first resistor to one of said lines whereby the output change of each of the first and second devices is substantially proportional to the difference between the voltages applied to the inputs of these devices, the outputs of the first and second devices being in push-pull relation, a second differential stage including a second resistor and said third and fourth devices connected in differential amplifier configuration with the common electrodes of these devices connected through the second resistor to one of said lines, whereby the output change of each of the third and fourth devices is proportional to the difference between the voltages applied to the inputs of these devices, the outputs of the third and fourth devices being in push-pull configuration, there being a phase inversion between the input and output of each of said devices, means coupling the output electrode of the first device to the input electrode of the third device, means coupling the output electrode of the second device to the input electrode of the fourth device, a capacitively coupled feedback circuit connecting the output electrode of the third device to the input electrode of the second device, a capacitively coupled feedback circuit connecting the output electrode of the fourth device to the input electrode of the first device, the impedance of each of said feedback circuits decreasing as frequency increases for frequency values below a predetermined frequency, each of said feedback circuits having substantially zero impedance for frequencies above said predetermined frequency, an amplifying section having an input circuit coupled to the output electrode of one of said third and fourth devices, said amplifying section having a constant gain for all frequencies below said predetermined frequency, said amplifying section having decreasing gain as frequency increases in a frequency range immediately above said predetermined frequency, and negative feedback network means coupling the output of said amplifying section to the input electrode of that one of said first and second devices which is coupled to the input of said one of said third and fourth devices.

6. Amplifying apparatus comprising first and second power supply lines adapted to be connected to opposite sides of a power supply source, first, second, third and fourth translating devices each having an input electrode, an output electrode and a common electrode, a differential amplifier section having respective input and output circuit means, said differential amplifier section having first and second differential stages, said first differential stage including a first resistance and said first and second devices connected in differential amplifier configuration with the common electrodes of these devices connected through said first resistance to one of said lines whereby the output change of each of the first and second devices is substantially proportional to the difference between the voltages applied to the inputs of these devices, the outputs of the first and second devices being in push-pull relation, said second differential stage including a second resistance and said third and fourth devices connected in differential amplifier configuration with the common electrodes of these devices connected through said second resistance to one of said lines, whereby the output change of each of the third and fourth devices is proportional to the difference between the voltages applied to the inputs of these devices, the outputs of the third and fourth devices being in push-pull configuration, there being a phase inversion between the input and output of each of said devices, means coupling the output electrode of the first device to the input electrode of the third device, means coupling the output electrode of the second device to the input electrode of the fourth device, there being a phase inversion between the outputs of said first and third devices and between the outputs of said second and fourth devices, a first RC network in circuit with the input electrode of said second device, said RC network having a capacitor and a time constant $t_2$, a capacitively coupled feedback circuit connecting the output electrode of the third device through said capacitor to the input electrode of the second device, a capacitively coupled feedback circuit connecting the output electrode of the fourth device to the input electrode of the first device, a second amplifier section having respective input and output circuits, the input circuit of the second amplifier section being coupled to the output circuit means of said differential amplifier section, said second amplifier section having a fifth translating device and a second RC network in circuit with said fifth device, said second RC network having a time constant $t_3$, the value of each of $t_2$ and $t_3$ being the same as the value of the other within $\pm$ 25% tolerance.

7. The combination as in claim 6 and further including a negative feedback network connected from the output circuit means of the second amplifier section to the input circuit means of the differential amplifier section.

8. The combination as in claim 6 wherein $t_2$ and $t_3$ are substantially equal to each other.

9. Amplifying apparatus comprising first, second, third, fourth and fifth translating devices each having respective input, output and common electrodes, first, second and third lines for connection to first, second and third terminals respectively of a power supply source wherein the first and second terminals are of opposite polarity and the third terminal is common reference to the first and second terminals, means coupling the output electrode of each of said first, second, third and fourth devices to said first line, first resistance means through which the common electrodes of the first and second devices are coupled to said second line, second resistance means through which the common electrodes of the third and fourth devices are coupled to said second line, the respective output electrodes of the first and second devices being connected to the input electrodes of the third and fourth devices respectively, first capacitor means connected between the output electrode of the third device and the input electrode of the second device, second capacitor means connected between the output electrode of the fourth device and the input electrode of the first device, resistance means connected between the input electrode of the second device and said third line, first and second input terminals for receiving input signals thereacross, the first input terminal being connected to the input electrode of the first device, the second input terminal being connected to said third line, and an amplifying section comprising said fifth device, a coupling resistor through which the output electrode of the fifth device is connected to one of said first and second lines, a resistor through which the common electrode of the fifth device is connected to the other of said first and second lines, means connecting the output electrode of the third device to the input electrode of the fifth device, means for taking an output from across said coupling resistor, and third capacitance means connected effectively in parallel with said coupling resistor.

10. Amplifying apparatus comprising first, second, third, fourth and fifth transistor means each having respective base, emitter and collector electrodes, first, second and third lines for connection to first, second and third terminals respectively of a power supply source wherein the first and second terminals are of opposite polarity and the third terminal is common reference to the first and second terminals, a plurality of resistors, the collector electrode of each of said first, second, third and fourth transistor means being connected through a different one of said resistors to said first line, a first resistor through which the emitter electrodes of the first and second transistor means are coupled to said second line, a second resistor through which the emitter electrodes of the third and fourth transistor means are coupled to said second line, means connecting the respective collector electrodes of the first and second transistor means to the base electrodes of the third and fourth transistor means respectively, first capacitance means connected between the collector electrode of the third transistor means and the base electrode of the second transistor means, second capacitance means connected between the collector electrode of the fourth transistor means and the base electrode of the first transistor means, resistance means connected between the base electrode of the second transistor means and said third line, a first input terminal connected to the base electrode of the first transistor means, a second input terminal connected to said third line, each said first and second capacitance means providing impedance which decreases as frequency increases for frequency values below a predetermined frequency, each said capacitance means being a substantial short circuit for all frequencies above said predetermined frequency $\omega_2$ expressed in radians/second, whereby above said predetermined frequency the collector electrodes of the third and fourth transistor means are substantially connected to the base electrodes of the first and second transistor means respectively, the time constant associated with said predetermined frequency being $t_2$ expressed in seconds and where $$t_2=\frac{1}{\omega_2}$$

and an amplifying section comprising said fifth transistor, a coupling resistor through which the collector electrode of the fifth transistor means is connected to one of said first and second lines, a resistor through which the emitter electrode of the fifth transistor means is connected to the other of said first and second lines, means connecting the collector electrode of the third transistor means to the base electrode of the fifth transistor means, means for taking an output from across said coupling resistor, said amplifying section having constant gain for frequencies below and up to a certain frequency $\omega_3$ expressed in radians/second, the time constant associated with said certain frequency being $t_3$ expressed in seconds and where $$t_3=\frac{1}{\omega_3}$$

the value of each of $t_2$ and $t_3$ being within the range of values extending from 75% to 125% of the value of the other, and means including an RC circuit for causing the gain of said amplifying section to decrease as frequency increases in a frequency range immediately above said certain frequency, said RC circuit including said coupling resistor and third capacitance means which third capacitance means is effectively connected in parallel with said coupling resistor.

11. The combination as in claim 10 wherein said predetermined and certain frequencies are substantially the same value.

12. Amplifying apparatus comprising first, second, third and fourth transistor means each having respective base, emitter and collector electrodes, first, second and third lines for connection to first, second and third terminals respectively of a power supply source wherein the first and second terminals are of opposite polarity and the third terminal is common reference to the first and second terminals, a plurality of resistors, the collector electrode of each of said first, second, third and fourth transistor means being connected through a different one of said resistors to said first line, a first resistor through which the emitter electrodes of the first and second transistor means are coupled to said second line, a second resistor through which the emitter electrodes of the third and fourth transistor means are coupled to said second line, the respective collector electrodes of the first and second transistor means being connected to the base electrode of the third and fourth transistor means respectively, first capacitance means connected between the collector electrode of the third transistor means and the base electrode of the second transistor means, second capacitance means connected between the collector electrode of the fourth transistor means and the base electrode of the first transistor means, resistance means connected between the base electrode of the second transistor means and said third line, a first input terminal connected to the base electrode of the first transistor means, a second input terminal connected to said third line, each said first and second capacitance means being constructed to provide impedance which decreases as frequency increases for frequency values below a predetermined frequency, each said capacitance means being a substantial short circuit for all frequencies above said predetermined frequency, whereby above said predetermined frequency the collector electrodes of the third and fourth transistor means are substantially connected to the base electrodes of the first and second transistor means respectively, an amplifying section comprising said fifth transistor, a coupling resistor through which the collector electrode of the fifth transistor means is connected to one of said first and second lines, a resistor through which the emitter electrode of the fifth transistor means is connected to the other of said first and second lines, means connecting the collector electrode of the third transistor means to the base electrode of the fifth transistor means, output means coupled to said coupling resistor, said amplifying section having constant gain for frequencies below and up to said predetermined frequency, and means including an RC circuit for causing the gain of said amplifying section to decrease as frequency increases in a frequency range immediately above said predetermined frequency, said RC circuit including said coupling resistor and third capacitance means which third capacitance means is connected between the collector electrode of the fifth transistor means and said third line, and negative feedback network means coupling said output means to the base electrode of said first transistor means.

13. Amplifying apparatus comprising first and second power supply busses adapted for connection to opposite sides of a power supply source, first, second, third and fourth translating devices each having an input electrode, an output electrode and a common electrode, a differential amplifier section having respective input and output means, said differential amplifier having first and second differential stages, said first differential stage including a first resistor and said first and second devices connected in differential amplifier configuration with the common electrodes of these devices connected through said first resistor to one of said busses whereby the output change of each of the first and second devices is substantially proportional to the difference between the voltages applied to the inputs of these devices, the outputs of the first and second devices being in push-pull relation in response to input signals applied to said input circuit means, said second differential stage including a second resistor and said third and fourth devices connected in differential amplifier configuration with the common electrodes of these devices connected through the second resistor to one of said busses whereby the output change of each of the third and fourth devices is proportional to the difference between the voltages applied to the inputs of these devices, the outputs of the third and fourth devices being in push-pull configuration in response to input signals applied to said input circuit means, there being a phase inversion between the input and output of each of said devices, means coupling the output electrode of the first device to the input electrode of the third device, means coupling the output electrode of the second device to the input electrode of the fourth device, there being a phase inversion between the outputs of said first and third devices and between the outputs of said second and fourth devices, a first RC network in circuit with the input electrode of the second device, said RC network having a capacitor and a time constant $t_2$, a capacitively coupled feedback circuit connecting the output electrode of the third device through said capacitor to the input electrode of the second device, a capacitively coupled feedback circuit connecting the output electrode of the fourth device to the input electrode of the first device, the impedance of each of said feedback circuits decreasing as frequency increases for frequency values below a predetermined frequency, each of said feedback circuits having substantially zero impedance for frequencies above said predetermined frequency, the time constant associated with said predetermined frequency being $t_2$, a second amplifying section including a fifth translating device, the second amplifying section having respective input and output circuits, the input circuit of the second amplifier section being coupled to the output circuit means of said differential amplifier section, said second amplifying section having a constant gain for all frequencies below a certain frequency, said second amplifying section having means including a second RC network coupled to said fifth translating device for decreasing the gain of that section as frequency increases in a frequency range immediately above said certain frequency, said second RC network having a time constant $t_3$ the time constant associated with said certain frequency being $t_3$, the value of each of $t_2$ and $t_3$ being in the range extending approximately from 75% to 125% of the value of the other.

14. The combination as in claim 13 wherein said predetermined and certain frequencies are substantially the same value.

15. The combination as in claim 13 and further including a negative feedback circuit connected between the output circuit of the second amplifying section and the input circuit means of the differential amplifier section.

16. Amplifying apparatus comprising first and second power supply lines adapted for connection to opposite sides of a power supply source, first, second, third and fourth translating devices each having an input electrode, an output electrode and a common electrode, a first differential stage including a first resistor, said first and second devices connected in differential amplifier configuration with the common electrodes of these devices connected through the first resistor to one of said lines whereby the output change of each of the first and second devices is substantially proportional to the difference between the voltages applied to the inputs of these devices, the outputs of the first and second devices being in push-pull relation, said first stage having an input circuit, a second differential stage including a second resistor and said third and fourth devices connected in differential amplifier configuration with the common electrodes of these devices connected through the second resistor to one of said lines, whereby the output change of each of the third and fourth devices is proportional to the difference between the voltages applied to the inputs of these devices, the outputs of the third and fourth devices being in push-pull configuration, said second stage having an output circuit, there being a phase inversion between the input and output of each of said devices, means coupling the output electrode of the first device to the input electrode of the third device, means coupling the output electrode of the second device to the input electrode of the fourth device, there being a phase inversion between the outputs of said first and third devices and between the outputs of said second and fourth devices, a capacitively coupled feedback circuit connecting the output electrode of the third device to the input electrode of the second device, a capacitively coupled feedback circuit connecting the output electrode of the fourth device to the input electrode of the first device, the impedance of each of said feedback circuits decreasing as frequency increases for frequency values below a predetermined frequency, each of said feedback circuits having substantially zero impedance for frequencies above said predetermined frequency, an amplifying section having respective input and output circuits, means coupling the input circuit of said amplifying section to the output circuit of said second stage, said amplifying section having a constant gain for all frequencies below said predetermined frequency, said amplifying section having decreasing gain as frequency increases in a frequency range immediately above said predetermined frequency, and negative feedback network means coupling the output circuit of said amplifying section to the input circuit of said first stage.

17. Amplifying apparatus comprising first and second power supply lines adapted to be connected to opposite sides of a power supply source, first, second, third and fourth translating devices each having an input electrode, a differential amplifier section having respective input and output circuit means, said differential amplifier section having first and second differential stages, said first differential stage including a first resistance and said first and second devices connected in differential amplifier configuration with the common electrodes of these devices connected through said first resistance to one of said lines whereby the output change of each of the first and second devices is substantially proportional to the difference between voltages applied to the inputs of these devices, the outputs of the first and second devices being in push-pull relation, said second differential stage including a second resistance and said third and fourth devices connected in differential amplifier configuration with the common electrodes of these devices connected through said second resistance to one of said lines, whereby the output change of each of the third and fourth devices is proportional to the difference between voltages applied to the inputs of these devices, the outputs of the third and fourth devices being in push-pull configuration, there being a phase inversion between the input and output of each of said devices, means coupling the output electrode of the first device to the input electrode of the third device, means coupling the output electrode of the second device to the input electrode of the fourth device, there being a phase inversion between the outputs of said first and third devices and between the outputs of said second and fourth devices, a capacitively coupled feedback circuit connecting the output electrode of the third device to the input electrode of the second device, a capacitively coupled feedback circuit connecting the output electrode of the fourth device to the input electrode of the first device, the impedance of each of said feedback circuits decreasing as frequency increases for frequency values below a predetermined frequency, each of said feedback circuits having substantially zero impedance for frequencies above said predetermined frequency, a second amplifier section having respective input and output circuits, the input circuit of the second amplifier section being coupled to the output circuit means of said differential amplifier section, said second amplifier section having a gain characteristic which is substantially constant for frequencies below said predetermined frequency and which gain decreases as the frequency increases for frequencies above said predetermined frequency, and a negative feedback network coupling the output circuit of the second amplifier section to the input circuit means of the differential amplifier section.

References Cited

UNITED STATES PATENTS

| | | | |
|---|---|---|---|
| 3,046,487 | 7/1962 | Matzen et al. | 330—28 X |
| 3,153,202 | 10/1964 | Woolam. | |
| 3,223,940 | 12/1965 | Early et al. | |
| 3,241,080 | 3/1966 | Hinrichs | 330—103 |

FOREIGN PATENTS

| | | |
|---|---|---|
| 619,062 | 3/1949 | Great Britain. |

OTHER REFERENCES

Willems: Network Table for Easier Control-System Design, pp 60–63, Electronics Design, vol. 11, No. 17, Aug. 16, 1963.

ROY LAKE, *Primary Examiner.*

F. D. PARIS, *Assistant Examiner.*